United States Patent
Kamimura (10) Patent No.: US 8,450,658 B2
(45) Date of Patent: May 28, 2013

(54) SEMICONDUCTOR PROCESSING APPARATUS

(75) Inventor: Masaki Kamimura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 525 days.

(21) Appl. No.: 12/713,978

(22) Filed: Feb. 26, 2010

(65) Prior Publication Data

US 2010/0213186 A1 Aug. 26, 2010

(30) Foreign Application Priority Data

Feb. 26, 2009 (JP) ................. 2009-044485

(51) Int. Cl.
*B23K 13/08* (2006.01)

(52) U.S. Cl.
USPC ........... 219/482; 219/486; 219/497; 219/405; 219/390; 392/416; 392/418

(58) Field of Classification Search
CPC ................................. H01L 21/67248
USPC ......... 219/482, 486, 497, 405, 390; 392/416, 392/418
See application file for complete search history.

(56) References Cited

U.S. PATENT DOCUMENTS

| | | | |
|---|---|---|---|
| 6,599,818 B2 * | 7/2003 | Dairiki | 438/486 |
| 7,643,736 B2 * | 1/2010 | Itani | 392/416 |
| 2006/0182390 A1 * | 8/2006 | Ji | 385/31 |
| 2009/0214193 A1 * | 8/2009 | Suzuki et al. | 392/411 |

FOREIGN PATENT DOCUMENTS

JP 7-200077 8/1995

* cited by examiner

*Primary Examiner* — Toan Le
(74) *Attorney, Agent, or Firm* — Finnegan, Henderson, Farabow, Garrett & Dunner, L.L.P.

(57) ABSTRACT

An output-history storing unit stores past and present measurement data input to a measurement-data input unit while distinguishing the measurement data for each of output sources. An output-fluctuation monitoring unit monitors, based on the measurement data stored in the output-history storing unit, output fluctuation in each of the output sources. An output control unit separately controls, based on the output fluctuation monitored by the output-fluctuation monitoring unit, outputs from the output sources.

20 Claims, 11 Drawing Sheets

| LAMP NO. | TIME t=0 | TIME t=T |
|---|---|---|
| LAMP 1 | $I_{1-0}$ | $I_{1-T}$ |
| LAMP 2 | $I_{2-0}$ | $I_{2-T}$ |
| ... | ... | ... |
| LAMP n | $I_{n-0}$ | $I_{n-T}$ |

| COORDINATE X | TIME t=0 | TIME t=T |
|---|---|---|
| 1 | $I_{1-0}(1)$ | $I_{1-T}(1)$ |
| 2 | $I_{1-0}(2)$ | $I_{2-T}(2)$ |
| ... | ... | ... |
| X | $I_{1-0}(X)$ | $I_{n-T}(X)$ |

SEMICONDUCTOR PROCESSING APPARATUS

CROSS-REFERENCE TO RELATED APPLICATIONS

This application is based upon and claims the benefit of priority from the prior Japanese Patent Application No. 2009-44485, filed on Feb. 26, 2009; the entire contents of which are incorporated herein by reference.

BACKGROUND OF THE INVENTION

1. Field of the Invention

The present invention relates to a semiconductor processing apparatus, and, more particularly is suitably applied to a method of monitoring aged deterioration in the output of a lamp used for thermal treatment of a semiconductor wafer.

2. Description of the Related Art

In thermal treatment and the like for a semiconductor wafer, there is a method of using a halogen lamp as a heating source to realize rapid temperature rise and temperature fall.

For example, Japanese Patent Application Laid-Open No. H7-200077 discloses a method of providing a plurality of temperature measuring units that measure temperatures at a plurality of points near a substrate to be processed and controlling, taking into account degrees of influence of heating units on the temperature measuring units, the heating units such that measurement values obtained from the temperature measuring units reach a target value.

However, in the heat treatment method in the past, when a plurality of halogen lamps are used as heating sources, a temperature distribution on a semiconductor wafer is non-uniform if degrees of deterioration in output fluctuate among the halogen lamps.

BRIEF SUMMARY OF THE INVENTION

A semiconductor processing apparatus according to an embodiment of the present invention comprises: a plurality of output sources used for processing of a wafer; an output measuring unit that measures outputs from the output sources; a measurement-data input unit that receives input of measurement data measured by the output measuring unit; an output-history storing unit that stores past and present measurement data input to the measurement-data input unit while distinguishing the measurement data for each of the output sources; an output-fluctuation monitoring unit that monitors, based on the measurement data stored in the output-history storing unit, output fluctuation in each of the output sources; and an output control unit that separately controls, based on the output fluctuation monitored by the output-fluctuation monitoring unit, the outputs from the output sources.

DETAILED DESCRIPTION OF THE INVENTION

Exemplary embodiments of the present invention are explained in detail below with reference to the accompanying drawings. In first to sixth embodiments explained below, a lamp annealing apparatus is explained as an example of a semiconductor processing apparatus. In a seventh embodiment, an ultrasonic cleaning apparatus is explained as an example of a semiconductor processing apparatus. The present invention is not limited by the embodiments.

Figure 1:
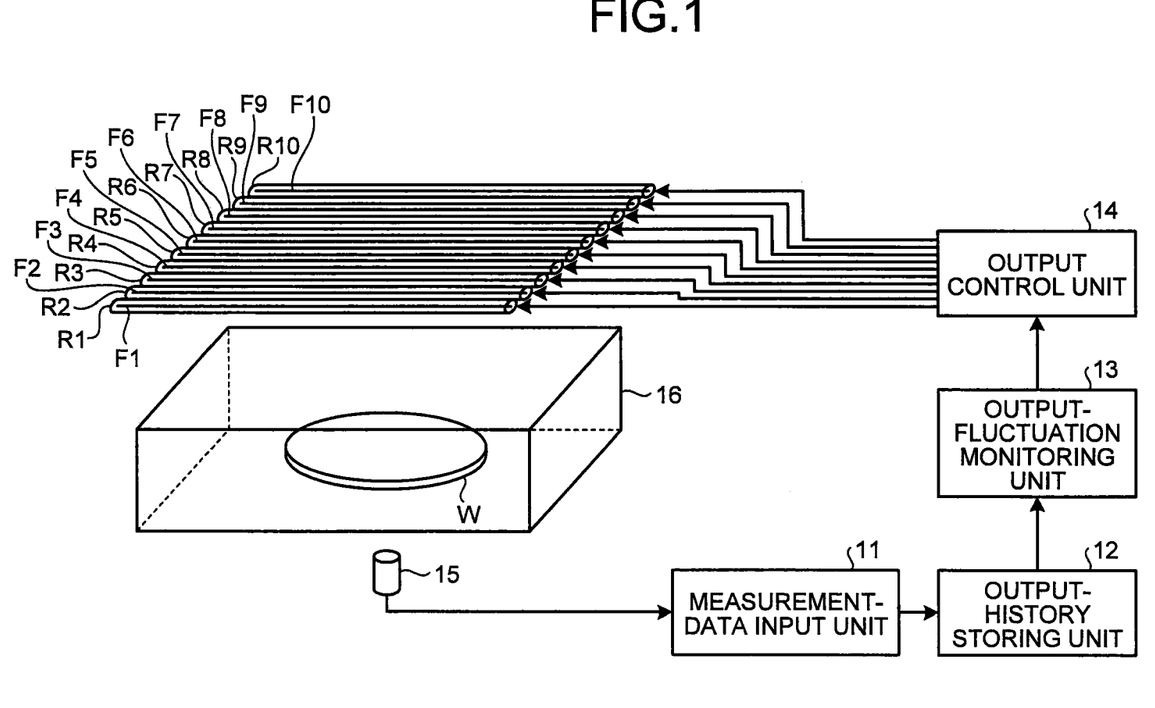
FIG. 1 is a perspective view of the schematic configuration of a semiconductor processing apparatus according to a first embodiment of the present invention.

FIG. 1 is a perspective view of the schematic configuration of a semiconductor processing apparatus according to a first embodiment of the present invention.

In FIG. 1, the semiconductor processing apparatus includes rod-like light sources R1 to R10 as a plurality of output sources used for processing of a wafer W. The semiconductor processing apparatus includes a radiation thermometer 15 as an output measuring unit that measures the outputs from the rod-like light sources R1 to R10. Filaments F1 to F10 are respectively provided in the rod-like light sources R1 to R10 and stored in quartz tubes. As the rod-like light sources R1 to R10, for example, rod-like halogen lamps can be used. As the wafer W, for example, a semiconductor wafer of Si or the like can be used.

The semiconductor processing apparatus includes a chamber 16 that houses the wafer W. As a material of the chamber 16, for example, quartz can be used. The rod-like light sources R1 to R10 are horizontally arranged side by side on the chamber 16. The radiation thermometer 15 is arranged below the chamber 16.

The semiconductor processing apparatus includes a measurement-data input unit 11, an output-history storing unit 12, an output-fluctuation monitoring unit 13, and an output control unit 14. The measurement-data input unit 11 can receive the input of measurement data measured by the radiation thermometer 15. The output-history storing unit 12 can store past and present measurement data input to the measurement-data input unit 11 while distinguishing the measurement data for each of the rod-like light sources R1 to R10. The output-fluctuation monitoring unit 13 can monitor, based on the measurement data stored in the output-history storing unit 12, the output fluctuation in each of the rod-like light sources R1 to R10. The output control unit 14 can separately control, based on the output fluctuation monitored by the output-fluctuation monitoring unit 13, the outputs from the rod-like light sources R1 to R10. When the output fluctuations in the rod-like light sources R1 to R10 are monitored, the output control unit 14 can sequentially turn on the rod-like light sources R1 to R10. When thermal treatment of the wafer W is performed, the output control unit 14 can collectively turn on the rod-like light sources R1 to R10.

When the thermal treatment of the wafer W is performed, the semiconductor processing apparatus shown in FIG. 1 can be caused to operate as a spike rapid thermal annealing apparatus. In activating impurities injected into the wafer W, the spike rapid thermal annealing apparatus can suppress spread of the impurities by collectively turning on the rod-like light sources R1 to R10 only for one to two seconds while adjusting the outputs from the rod-like light sources R1 to R10 such that temperature equal to or higher than 1000° C. can be obtained.

When the output fluctuations in the rod-like light sources R1 to R10 are monitored, the output control unit 14 sequentially turns on the rod-like light sources R1 to R10. Lighting times of the rod-like light sources R1 to R10 can be set to, for example, one second. The radiation thermometer 15 sequentially measures the outputs from the rod-like light sources R1 to R10 via the wafer W and inputs measurement data to the measurement-data input unit 11. The radiation thermometer 15 can directly measure the outputs from the rod-like light sources R1 to R10 without the intervention of the wafer W. When the measurement data measured by the radiation thermometer 15 is input to the measurement-data input unit 11, the output-history storing unit 12 stores the measurement data while distinguishing the measurement data for each of the rod-like light sources R1 to R10. The radiation thermometer 15 can measure the outputs from the rod-like light sources R1 to R10 periodically or according to occurrence of a predetermined event. The output-history storing unit 12 stores measurement data of the outputs while distinguishing the measurement data for each of the rod-like light sources R1 to R10.

The output-fluctuation monitoring unit 13 monitors the output fluctuation in each of the rod-like light sources R1 to R10 referring to the past and present measurement data stored in the output-history storing unit 12. When output fluctuation is detected in any one of the rod-like light sources R1 to R10, the output control unit 14 separately controls the outputs from the rod-like light sources R1 to R10.

As a method of causing the output control unit 14 to separately control the outputs from the rod-like light sources R1 to R10, it is possible to cause the output control unit 14 to control the outputs from the rod-like light sources R1 to R10 such that the outputs from the rod-like light sources R1 to R10 are uniformalized. For example, For example, when the output from the rod-like light source R1 falls 10%, the output from the rod-like light source R2 falls 20%, and no output fluctuation occurs in the rod-lie light sources R3 to R10, it is possible to cause the output control unit 14 to increase the output from the rod-like light source R1 10%, increase the output from the rod-like light source R2 20%, and maintain the outputs of the rod-like light sources R3 to R10.

When output fluctuation in any one of the rod-like light sources R1 to R10 is detected by the output-fluctuation monitoring unit 13 and the output fluctuation exceeds a specified value, it is also possible to cause the output control unit 14 to output a message for urging a user to replace the rod-like light source in which the output fluctuation occurs. For example, when an output difference among the rod-like light sources R1 to R10 is equal to or larger than 15%, the output control unit 14 can urge the user to replace a deteriorated one(s) of the rod-like light sources R1 to R10.

Consequently, even when there is fluctuation in degrees of deterioration in the outputs of the rod-like light sources R1 to R10 used for the thermal treatment of the wafer W, the outputs of the rod-like light sources R1 to R10 can be uniformalized. This makes it possible to uniformalize a temperature distribution on the wafer W.

Figure 2:
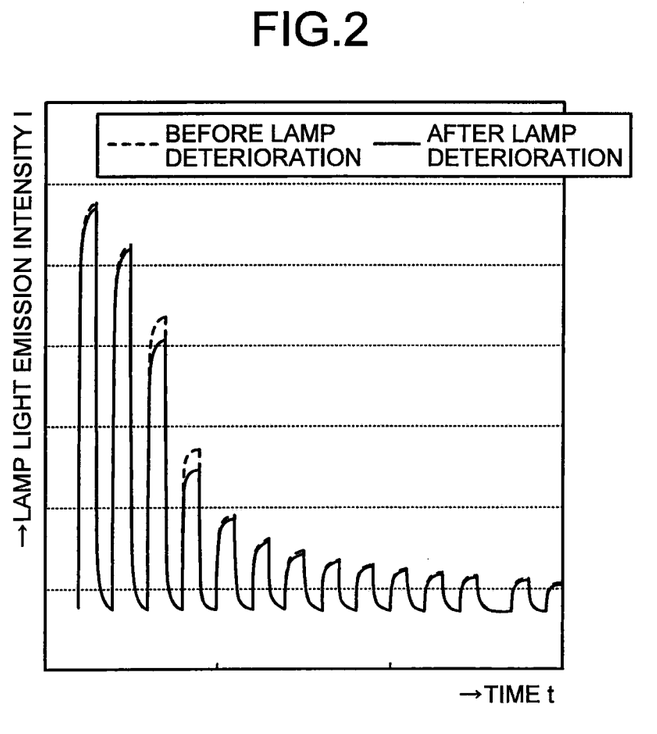
FIG. 2 is a graph of the light emission intensities of rod-like light sources R1 to R10 before and after deterioration measured by a radiation thermometer 15 shown in FIG. 1.

FIG. 2 is a graph of the light emission intensities of the rod-like light sources R1 to R10 before and after deterioration measured by the radiation thermometer 15 shown in FIG. 1.

It is assumed that the radiation thermometer 15 is set right below the rod-like light source R1. The rod-like light sources R1 to R10 are sequentially turned on. The outputs from the rod-like light sources R1 to R10 are measured by the radiation thermometer 15.

When the position of the radiation thermometer 15 is fixed to a position right below the rod-like light source R1, the radiation thermometer 15 is closest to the rod-like light source R1 and most distant from the rod-like light source R10. Therefore, even when there is no deterioration in the rod-like light sources R1 to R10, the light emission intensities measured by the radiation thermometer 15 falls as distances among the rod-like light sources R1 to R10 increase.

After the rod-like light sources R1 to R10 are used for a predetermined time, the rod-like light sources R1 to R10 are sequentially turned on again. The outputs from the rod-like light sources R1 to R10 are measured by the radiation thermometer 15 again. When any one of the rod-like light sources R1 to R10 is deteriorated, the light emission intensity of the rod-like light source falls. Therefore, it is possible to separately detect the output fluctuations in the rod-like light sources R1 to R10 by individually comparing the past and present light emission intensities of the rod-like light sources R1 to R10.

Figure 3:
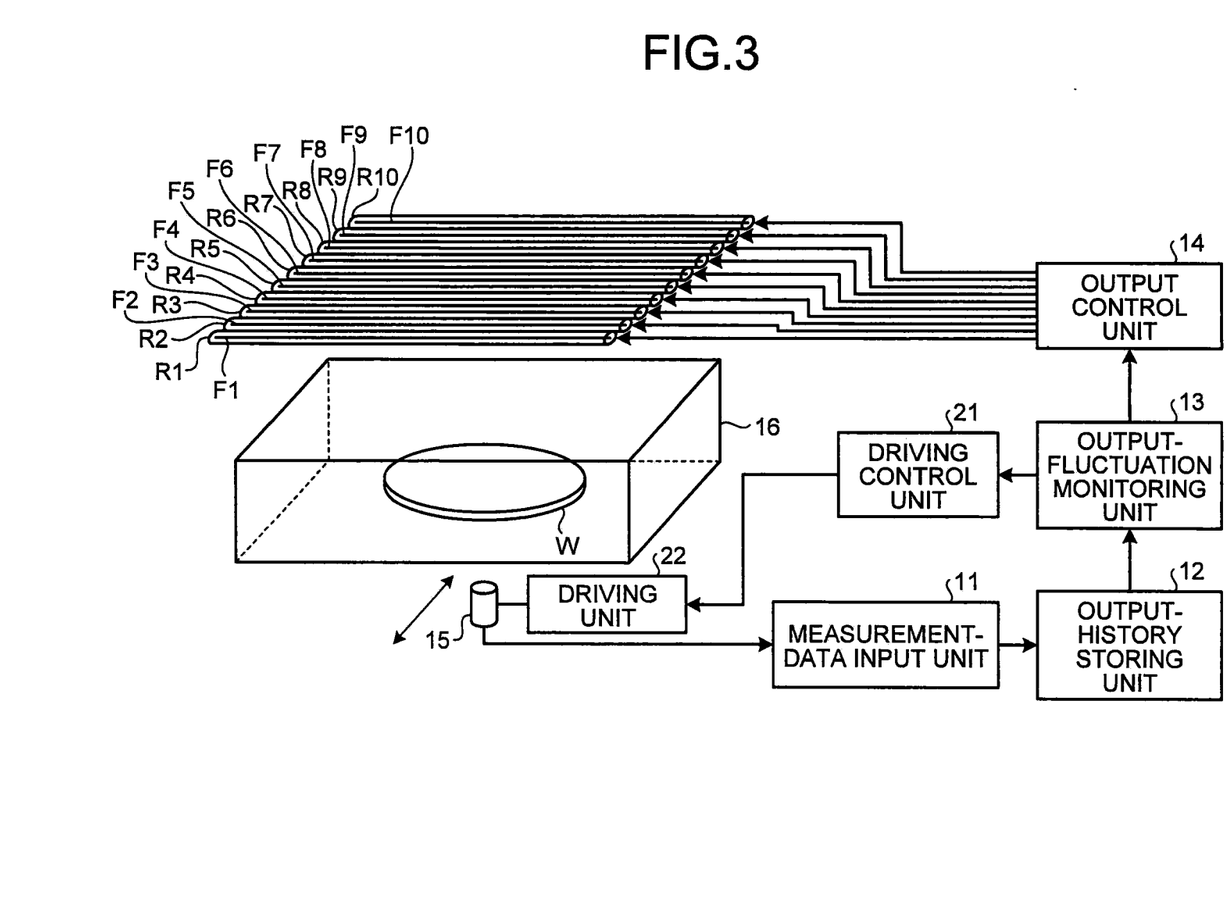
FIG. 3 is a perspective view of the schematic configuration of a semiconductor processing apparatus according to a second embodiment of the present invention.

FIG. 3 is a perspective view of the schematic configuration of a semiconductor processing apparatus according to a second embodiment of the present invention.

In FIG. 3, the semiconductor processing apparatus according to the second embodiment includes a driving unit 22 and a driving control unit 21 in addition to the components of the semiconductor processing apparatus shown in FIG. 1. The driving unit 22 can horizontally move the radiation thermometer 15 along an array direction of the rod-like light sources R1 to R10. As the driving unit 22, for example, a linear guide, a robot arm, or the like can be used. The driving control unit 21 can perform, based on an instruction from the output-fluctuation monitoring unit 13, driving control for the driving unit 22.

When the output fluctuations in the rod-like light sources R1 to R10 are monitored, the output control unit 14 sequentially turns on the rod-like light sources R1 to R10 while the driving unit 22 horizontally moves the radiation thermometer 15. The output-fluctuation monitoring unit 13 can cause the driving control unit 21 to control driving of the radiation thermometer 15 to be placed right below any one of the rod-like light sources R1 to R10 that is about to be turned on.

The radiation thermometer 15 sequentially measures the outputs from the rod-like light sources R1 to R10 via the wafer W and inputs measurement data to the measurement-data input unit 11. When the measurement data measured by the radiation thermometer 15 is input to the measurement-data input unit 11, the output-history storing unit 12 stores the measurement data while distinguishing the measurement data for each of the rod-like light sources R1 to R10.

The output-fluctuation monitoring unit 13 monitors the output fluctuation in each of the rod-like light sources R1 to R10 referring to the past and present measurement data stored in the output-history storing unit 12. When output fluctuation is detected in any one of the rod-like light sources R1 to R10, the output control unit 14 separately controls the outputs from the rod-like light sources R1 to R10.

The radiation thermometer 15 measures the outputs from the rod-like light sources R1 to R10 while being moved to right below any one of the rod-like light sources R1 to R10 that is about to be turned on. This makes it possible to equalize distances between the rod-like light sources R1 to R10 and the radiation thermometer 15 during the measurement even when only one radiation thermometer 15 is used. Therefore, it is possible to uniformalize the light emission intensities of the rod-like light sources R1 to R10 measured by the radiation thermometer 15 and improve measurement accuracy.

Figure 4:
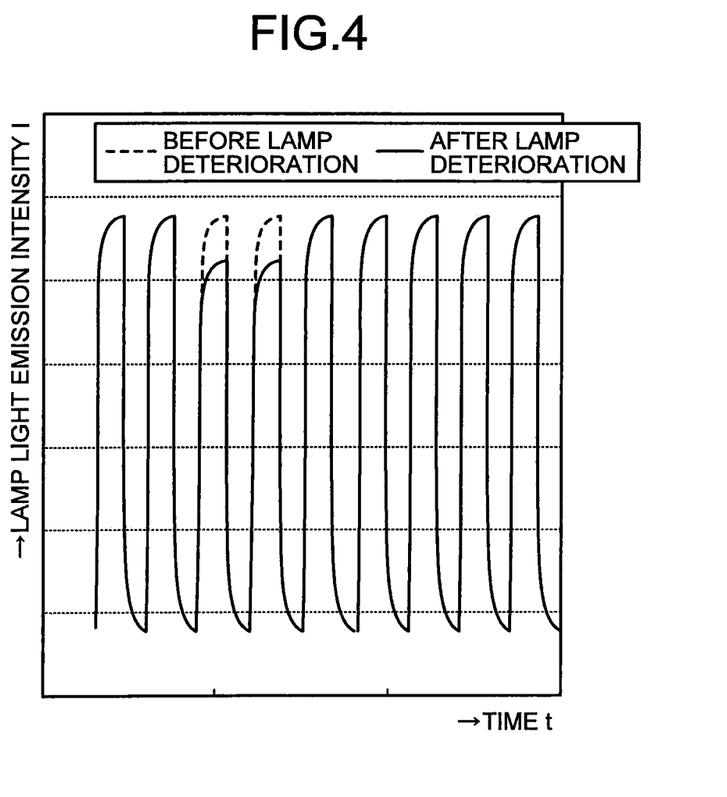
FIG. 4 is a graph of the light emission intensities of rod-like light sources R1 to R10 before and after deterioration measured by the radiation thermometer 15 shown in FIG. 3.

FIG. 4 is a diagram of the light emission intensities of the rod-like light sources R1 to R10 before and after deterioration measured by the radiation thermometer 15 shown in FIG. 3.

The output control unit 14 sequentially turns on the rod-like light sources R1 to R10 while the driving unit 22 moves the radiation thermometer 15 to right below any one of the rod-like light sources R1 to R10 that is about to be turned on. The radiation thermometer 15 measures the outputs from the rod-like light sources R1 to R10. After the rod-like light sources R1 to R10 are used for a predetermined time, the output control unit 14 sequentially turns on the rod-like light sources R1 to R10 again while the driving unit 22 moves the radiation thermometer 15 to right below any one of the rod-like light sources R1 to R10 that is about to be turned on. The radiation thermometer 15 measures the outputs from the rod-like light sources R1 to R10 again. When any one of the rod-like light sources R1 to R10 is deteriorated, the light emission intensity of the rod-like light source falls. Therefore, it is possible to separately detect the output fluctuations in the rod-like light sources R1 to R10 by individually comparing the past and present light emission intensities of the rod-like light sources R1 to R10.

Figure 5:
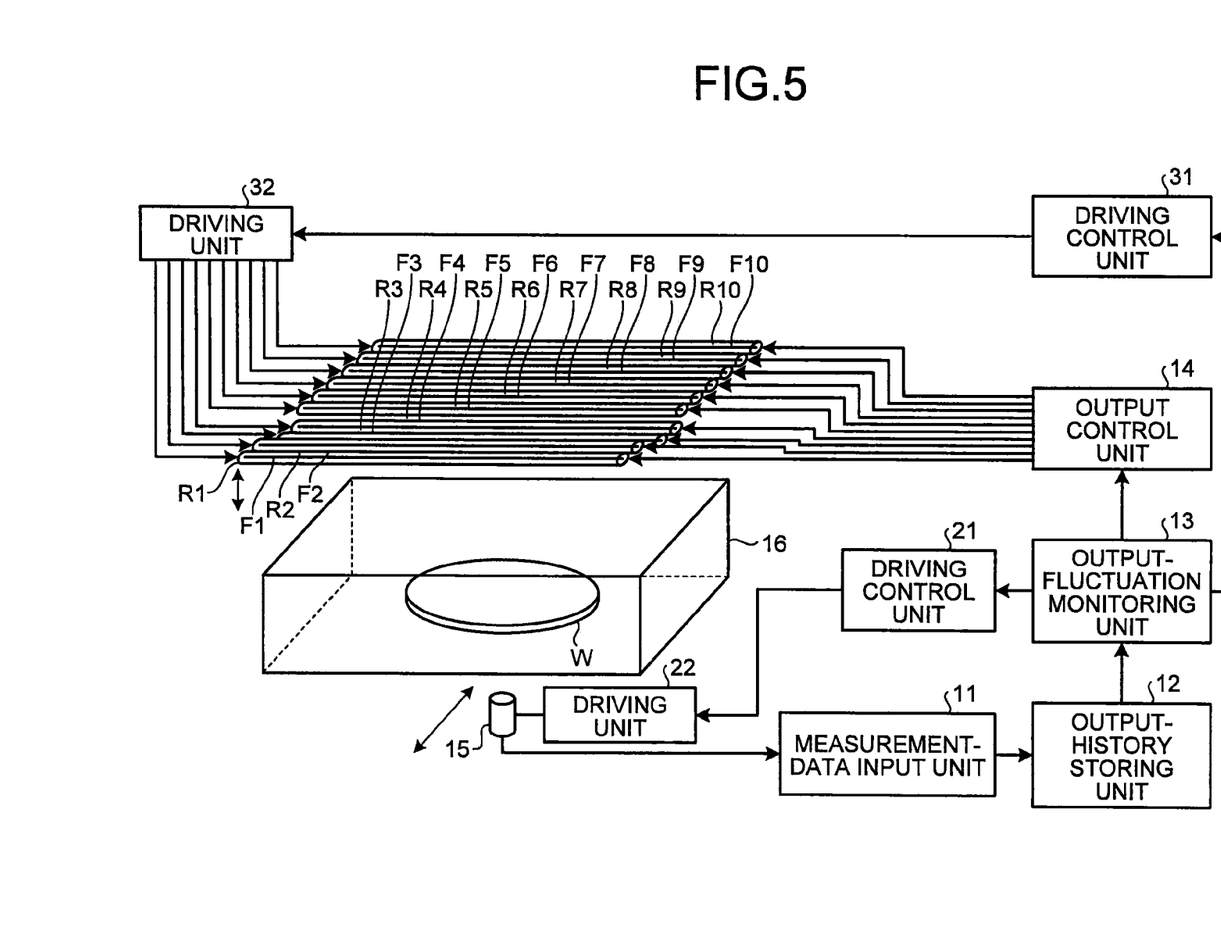
FIG. 5 is a perspective view of the schematic configuration of a semiconductor processing apparatus according to a third embodiment of the present invention.

FIG. 5 is a perspective view of the schematic configuration of a semiconductor processing apparatus according to a third embodiment of the present invention.

In FIG. 5, the semiconductor processing apparatus according to the third embodiment includes a driving unit 32 and a driving control unit 31 in addition to the components of the semiconductor processing apparatus shown in FIG. 3. The driving unit 32 can separately move the rod-like light sources R1 to R10 up and down. As the driving unit 32, for example, an elevating machine, a robot arm, or the like can be used. The driving control unit 31 can perform, based on an instruction from the output-fluctuation monitoring unit 13, driving control for the driving unit 32.

When the output fluctuations in the rod-like light sources R1 to R10 are monitored, the output control unit 14 sequentially turns on the rod-like light sources R1 to R10 while the driving unit 22 horizontally moves the radiation thermometer 15. The output-fluctuation monitoring unit 13 can cause the driving control unit 21 to control driving of the radiation thermometer 15 to be placed right below any one of the rod-like light sources R1 to R10 that is about to be turned on.

The radiation thermometer 15 sequentially measures the outputs from the rod-like light sources R1 to R10 via the wafer W and inputs measurement data to the measurement-data input unit 11. When the measurement data measured by the radiation thermometer 15 is input to the measurement-data input unit 11, the output-history storing unit 12 stores the measurement data while distinguishing the measurement data for each of the rod-like light sources R1 to R10.

The output-fluctuation monitoring unit 13 monitors the output fluctuation in each of the rod-like light sources R1 to R10 referring to the past and present measurement data stored in the output-history storing unit 12. When a fall in the output from any one of the rod-like light sources R1 to R10 is detected, the driving unit 32 lowers the rod-like light source to compensate for the fall in the output from the rod-like light source. For example, when the outputs of the rod-like light sources R3 and R4 fall 10%, the driving unit 32 lowers the rod-like light sources R3 and R4 to compensate for the 10% fall of the output. A relation between an amount of fall in the outputs of the rod-like light sources R1 to R10 and an amount of lowering of the rod-like light sources R1 to R10 can be calculated in advance. For example, it is possible to cause the driving control unit 31 to store the relation.

When the output from any one of the rod-like light sources R1 to R10 falls, it is possible to compensate for the fall in the output by lowering the rod-like light source to thereby uniformalize the outputs of the rod-like light sources R1 to R10 without increasing the output from the rod-like light source in which the deterioration occurs. Therefore, it is possible to prevent the life of the rod-like light source in which the deterioration occurs from being reduced and reduce cost for replacement of the rod-like light sources R1 to R10.

Figure 6:
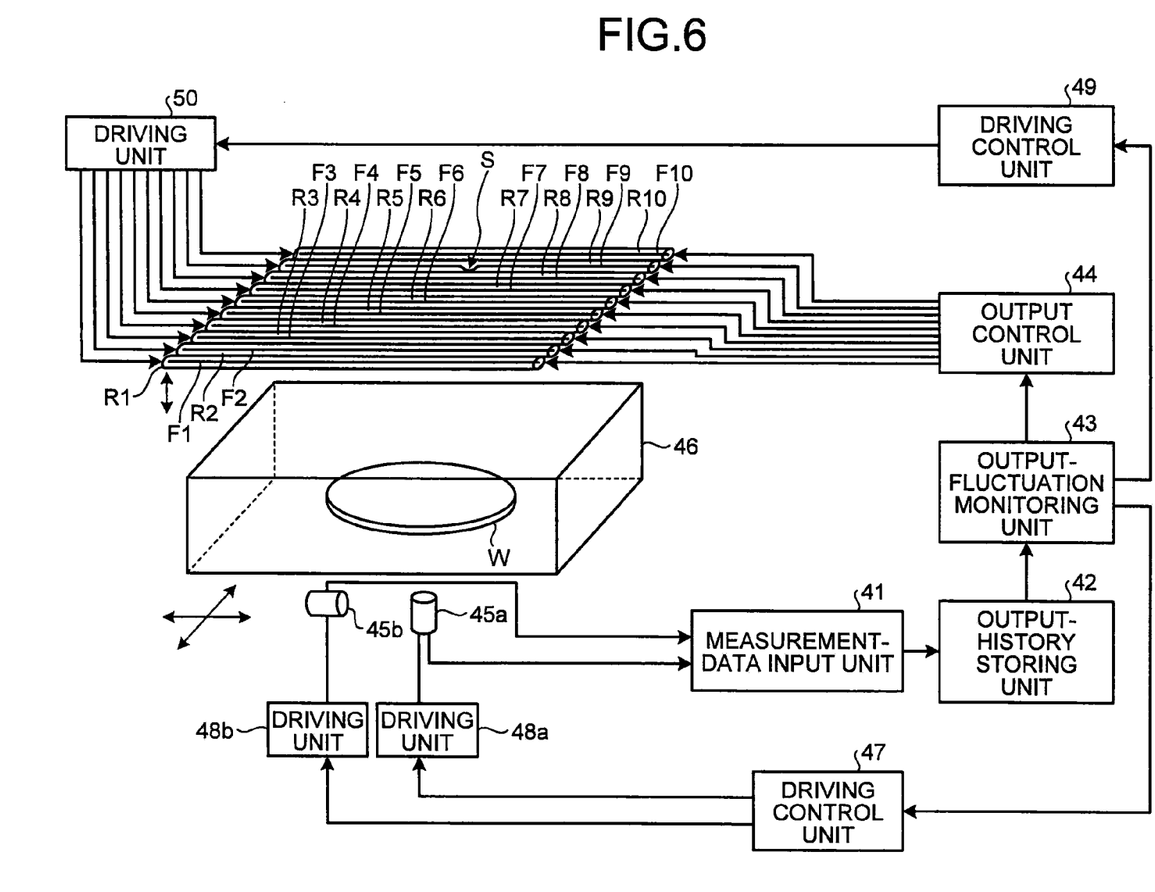
FIG. 6 is a perspective view of the schematic configuration of a semiconductor processing apparatus according to a fourth embodiment of the present invention.

FIG. 6 is a perspective view of the schematic configuration of a semiconductor processing apparatus according to a fourth embodiment of the present invention.

In FIG. 6, the semiconductor processing apparatus includes the rod-like light sources R1 to R10 as a plurality of output sources used for processing of the wafer W and includes radiation thermometers 45a and 45b as output measuring units that measure the outputs from the rod-like light sources R1 to R10. The filaments F1 to F10 are respectively provided in the rod-like light sources R1 to R10 and stored in quartz tubes. The semiconductor processing apparatus also includes a chamber 46 that houses the wafer W. The rod-like light sources R1 to R10 are horizontally arranged side by side on the chamber 46. The radiation thermometers 45a and 45b are arranged below the chamber 46.

In the radiation thermometers 45a and 45b, directions of measuring surfaces can be set different from each other. For example, in the radiation thermometer 45a, the measuring surface can be horizontally arranged to allow the radiation thermometer 45a to measure the outputs of the rod-like light sources R1 to R10 from below the rod-like sources R1 to R10. In the radiation thermometer 45b, the measuring surface can be vertically arranged to allow the radiation thermometer 45b to measure the outputs of the rod-like light sources R1 to R10 sideways.

The semiconductor processing apparatus further includes a measurement-data input unit 41, an output-history storing unit 42, an output-fluctuation monitoring unit 43, an output control unit 44, driving units 48a, 48b, and 50, and driving control units 47 and 49. The measurement-data input unit 41 can receive the input of measurement data measured by the radiation thermometers 45a and 45b. The output-history storing unit 42 can store past and present measurement data input to the measurement-data input unit 41 while distinguishing the measurement data for each of the rod-like light sources R1 to R10.

Figure 7:
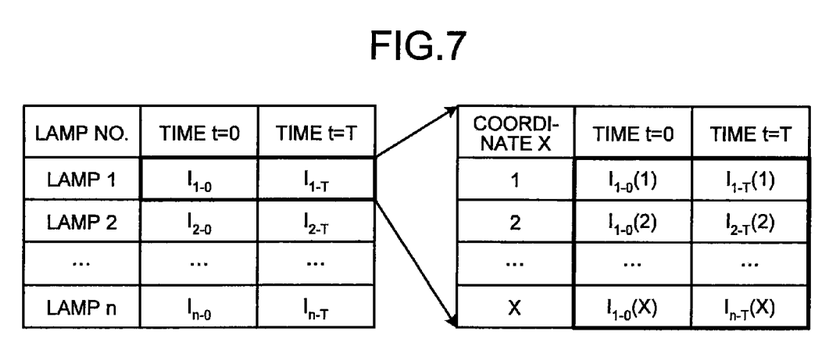
FIG. 7 is a diagram of an example of an output history stored in an output-history storing unit 42 shown in FIG. 6.

FIG. 7 is a diagram of an example of an output history stored in the output-history storing unit 42 shown in FIG. 6.

In FIG. 7, lamp numbers for identifying the rod-like light sources R1 to R10 are given to the rod-like light sources R1 to R10. Positions in the longitudinal direction of the rod-like light sources R1 to R10 can be given as X coordinates. Measurement data at time t=0 and time t=T input to the measurement-data input unit 41 are stored for each of the lamp numbers. In each of the lamp numbers, the measurement data at time t=0 and time t=T input to the measurement-data input unit 41 are stored for each of the coordinates X.

In FIG. 6, the output-fluctuation monitoring unit 43 can monitor, based on the measurement data stored in the output-history storing unit 42, the output fluctuation in each of the rod-like light sources R1 to R10. The output control unit 44 can separately control, based on the output fluctuations monitored by the output-fluctuation monitoring unit 43, the outputs from the rod-like light sources R1 to R10. When the output fluctuations in the rod-like light sources R1 to R10 are monitored, the output control unit 44 can sequentially turn on the rod-like light sources R1 to R10. When thermal treatment of the wafer W is performed, the output control unit 44 can collectively turn on the rod-like light sources R1 to R10. The driving units 48a and 48b can horizontally move the radiation thermometers 45a and 45b, respectively, along the array direction of the rod-like light sources R1 to R10 and horizontally move the radiation thermometers 45a and 45b, respectively, along the longitudinal direction of the rod-like light sources R1 to R10. The driving control unit 47 can perform, based on an instruction from the output-fluctuation monitoring unit 43, driving control for the driving units 48a and 48b. The driving unit 50 can separately move the rod-like light sources R1 to R10 up and down. The driving control unit 49 can perform, based on an instruction from the output-fluctuation monitoring unit 43, driving control for the driving unit 50.

When the output fluctuations in the rod-like light sources R1 to R10 are monitored, the output control unit 44 sequentially turns on the rod-like light sources R1 to R10 while the driving units 48a and 48b horizontally move the radiation thermometers 45a and 45b in two directions, respectively. The output-fluctuation monitoring unit 43 can cause, in a state in which the radiation thermometers 45a and 45b are moved to right below any one of the rod-like light sources R1 to R10 that is about to be turned on, the driving control unit 47 to control driving of the radiation thermometers 45a and 45b to be moved along the longitudinal direction of any one of the rod-like light source R1 to R10 just turned on.

The radiation thermometers 45a and 45b sequentially measure the outputs from the rod-like light sources R1 to R10 via the wafer W and input measurement data to the measurement-data input unit 41. When the measurement data measured by the radiation thermometers 45a and 45b are input to the measurement-data input unit 41, the output-history storing unit 42 stores the measurement data while distinguishing the measurement data for each of the rod-like light sources R1 to R10.

The output-fluctuation monitoring unit 43 monitors the output fluctuation in each of the rod-like light sources R1 to R10 referring to the past and present measurement data stored in the output-history storing unit 42. When output fluctuation is detected in any one of the rod-like light sources R1 to R10, the output control unit 44 separately controls the outputs from the rod-like light sources R1 to R10.

When a fall in the output from any one of the rod-like light sources R1 to R10 is detected, it is possible to increase the outputs from the rod-like light sources R1 to R10 to compensate for the fall in the output. Alternatively, when a fall in the output from any one of the rod-like light sources R1 to R10 is detected, it is also possible to control the driving unit 50 to lower the rod-like light sources R1 to R10 to compensate for the fall in the output of the rod-line light source.

The radiation thermometers 45a and 45b are moved along the longitudinal direction of any one of the rod-like light sources R1 to R10 just turned on. This makes it possible to detect sagging (deformation of the filament F8) S that occurs in the filament F8 of the rod-like light source R8. When the sagging S occurs, measurement data of light emission intensity changes according to a degree and the direction of the sagging S. Therefore, the degree and the direction of the sagging S can be surmised from the measurement data measured by the radiation thermometers 45a and 45b. This makes it possible to estimate a rupture period of the filament F8 due to the sagging S and urge a user to replace the rod-like light source R8 before the filament F8 ruptures. Therefore, it is possible to prevent a situation in which the filament F8 ruptures during thermal treatment of the wafer W and the wafer W has to be discarded.

The radiation thermometers 45a and 45b are caused to measure the outputs from the rod-like light sources R1 to R10 from two directions. This makes it possible to improve accuracy of quantification of the degree and the direction of the sagging S and improve accuracy of estimation of a rupture period of the filament F8 due to the sagging S.

Figure 8A:
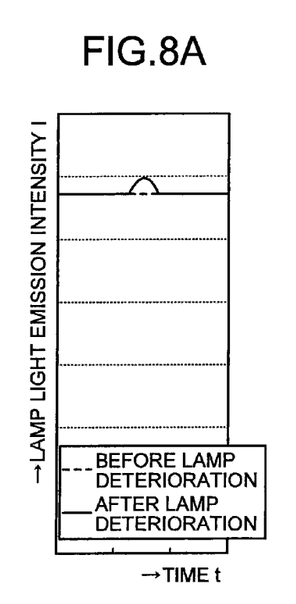
FIGS. 8A and 8B are graphs of the light emission intensities of the rod-like light sources R1 to R10 before and after deterioration respectively measured by radiation thermometers 45a and 45b shown in FIG. 6.
Figure 8B:
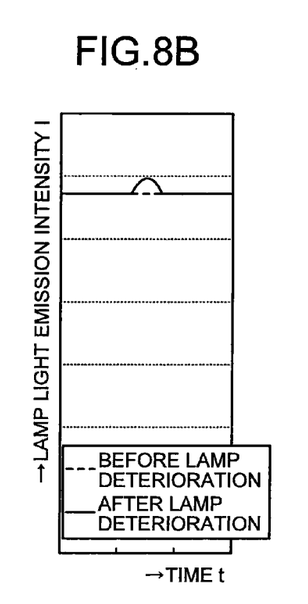

FIGS. 8A and 8B are graphs of the light emission intensities of the rod-like light sources R1 to R10 before and after deterioration respectively measured by the radiation thermometers 45a and 45b shown in FIG. 6. FIG. 8A indicates the light intensity of the rod-like light source R8 before and after deterioration measured by the radiation thermometer 45a shown in FIG. 6 when the radiation thermometer 45a is moved along the longitudinal direction of the rod-like light source R8. FIG. 8B indicates the light emission intensity of the rod-like light source R8 before and after deterioration measured by the radiation thermometer 45b shown in FIG. 6 when the radiation thermometer 45b is moved along the longitudinal direction of the rod-like light source R8.

When it is assumed that sagging S hanging downward occurs in the filament F8, a distance between the filament F8 and the radiation thermometers 45a and 45b is short in a position where the sagging S occurs. Therefore, the light emission intensity of the rod-like light source R8 measured by the radiation thermometers 45a and 45b increases in the position where the sagging S occurs. When an amount of the hanging of the sagging S increases and the sagging S comes into contact with the quartz tube that houses the filament F8, the filament F8 and the quartz tube react with each other to cause the rupture of the filament F8. This makes it possible to surmise the degree and the direction of the sagging S from the measurement data measured by the radiation thermometers 45a and 45b and estimate a rupture period of the filament F8 due to the sagging S.

In the fourth embodiment, when the radiation thermometers 45a and 45b are caused to measure the output of any one of the rod-like light sources R1 to R10 just turned on, the output-fluctuation monitoring unit 43 can instruct the driving control unit 49 to lower the rod-like light source. For example, when it is assumed that the rod-like light source R8 is just turned on, it is possible to cause, in a state in which the rod-like light source R8 is lowered, the radiation thermometers 45a and 45b to measure the output from the rod-like light source R8 while moving the radiation thermometers 45a and 45b along the longitudinal direction of the rod-like light source R8.

This makes it possible to cause the radiation thermometer 45b to measure the output from the rod-like light source R8 sideways or obliquely while preventing the rod-like light sources R7 and R7 adjacent to the rod-like light source R8 from interfering with the measurement and improve measurement accuracy of the output from the rod-like light source R8.

Figure 9:
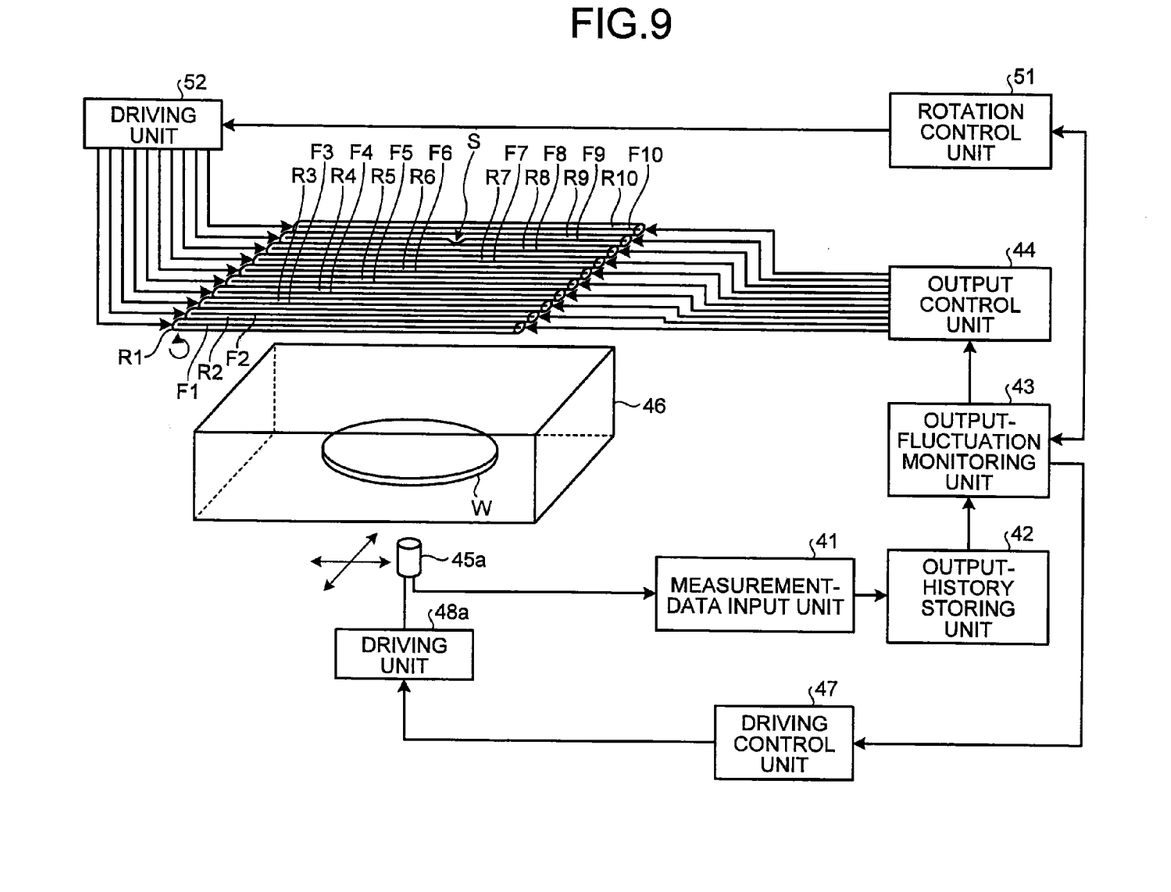
FIG. 9 is a perspective view of the schematic configuration of a semiconductor processing apparatus according to a fifth embodiment of the present invention.

FIG. 9 is a perspective view of the schematic configuration of a semiconductor processing apparatus according to a fifth embodiment of the present invention.

In FIG. 9, the semiconductor processing apparatus according to the fifth embodiment includes a driving unit 52 and a rotation control unit 51 instead of the driving unit 50 and the driving control unit 49 of the semiconductor processing apparatus shown in FIG. 6. The semiconductor processing apparatus shown in FIG. 6 includes the two radiation thermometers 45a and 45b having the different directions of measurement. The semiconductor processing apparatus shown in FIG. 9 includes only the radiation thermometer 45a to measure, only from one direction, the outputs from the rod-like light sources R1 to R10.

The driving unit 52 can separately rotate the rod-like light sources R1 to R10 around respective axes thereof. The rotation control unit 51 can perform, based on an instruction from the output-fluctuation monitoring unit 43, rotation control for the driving unit 52.

When the output fluctuation in the rod-like light sources R1 to R10 are monitored, the output control unit 44 sequentially turns on the rod-like light sources R1 to R10 while the driving unit 48a horizontally moves the radiation thermometer 45a in the two directions. The output-fluctuation monitoring unit 43 can cause, in a state in which the radiation thermometer 45a is moved to right below any one of the rod-like light sources R1 to R10 that is about to be turned on, the driving control unit 47 to control driving of the radiation thermometer 45a to be moved along the longitudinal direction of any one of the rod-like light source R1 to R10 just turned on.

The output-fluctuation monitoring unit 43 can stop the radiation thermometer 45a below any one of the rod-like light sources R1 to R10 just turned on and cause the rotation control unit 51 to control the rotation of the rod-like light sources R1 to R10 to rotate the rod-like light source around the axis thereof.

The radiation thermometer 45a sequentially measures the outputs from the rod-like light sources R1 to R10 via the wafer W and inputs measurement data to the measurement-data input unit 41. When the measurement data measured by the radiation thermometer 45a is input to the measurement-data input unit 41, the output-history storing unit 42 stores the measurement data while distinguishing the measurement data for each of the rod-like light sources R1 to R10.

The output-fluctuation monitoring unit 43 monitors the output fluctuation in each of the rod-like light sources R1 to R10 referring to the past and present measurement data stored in the output-history storing unit 42. When output fluctuation is detected in any one of the rod-like light sources R1 to R10, the output control unit 44 separately controls the outputs from the rod-like light sources R1 to R10.

When a fall in the output from any one of the rod-like light sources R1 to R10 is detected, it is possible to increase the outputs from the rod-like light sources R1 to R10 to compensate for the fall in the output.

The radiation thermometer 45a are caused to measure the output of any one of the rod-like light sources R1 to R10 just turned on while causing the rod-like light source around the axis thereof. This makes it possible to improve accuracy of quantification of the degree and the direction of the sagging S and improve surmise accuracy of a rupture period of the filament F8 due to the sagging S even when the radiation thermometer 45a is caused to measure, from one direction, the outputs from the rod-like light sources R1 to R10.

For example, when sagging S hanging downward is detected from the filament F8, the output-fluctuation monitoring unit 43 can cause, via the rotation control unit 51, the rod-like light source R8 to direct the sagging S in the horizontal direction. This makes it possible to uniformalize a distance between the filament F8 and the wafer W and realize uniformalization of a temperature distribution on the wafer W even when the sagging S occurs in the filament F8.

Figure 10:
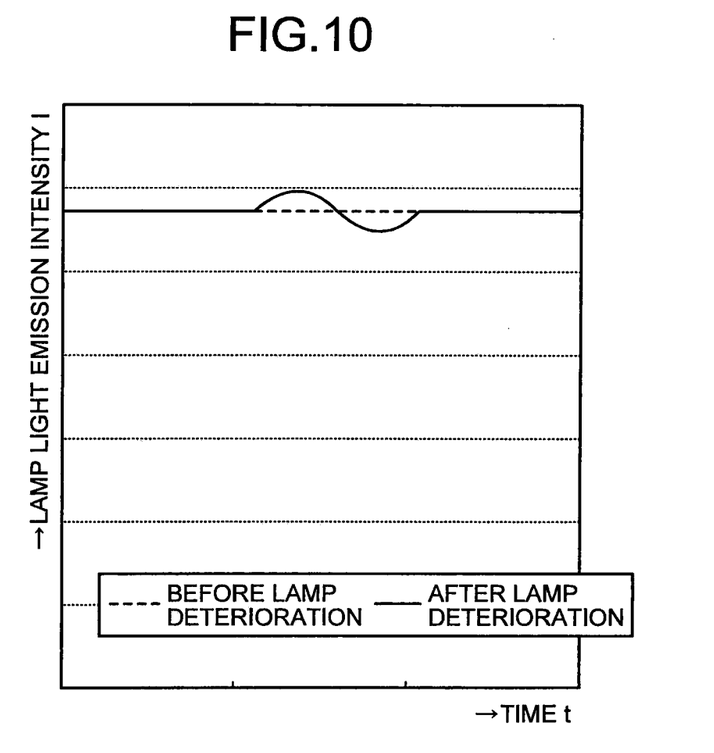
FIG. 10 is a graph of the light emission intensities of the rod-like light sources R1 to R10 before and after deterioration measured by the radiation thermometer 45a shown in FIG. 9.

FIG. 10 is a graph of the light emission intensities of the rod-like light sources R1 to R10 before and after deterioration measured by the radiation thermometer 45a shown in FIG. 9.

When it is assumed that sagging S hanging downward occurs in the filament F8, a distance between the filament F8 and the radiation thermometer 45a is reduced in a position where the sagging S occurs. Therefore, the light emission intensity of the rod-like light source R8 measured by the radiation thermometer 45a increases in the position where the sagging S occurs.

When the filament F8 is rotated around the axis thereof, the sagging S changes from the hanging state to horizontal, upward, horizontal, and downward in order. Therefore, in the position where the sagging S occurs, the light emission intensity of the rod-like light source R8 measured by the radiation thermometer 45a increases and decreases.

As a result, even when the radiation thermometer 45a is caused to measure, from one direction, the output from the rod-like light source R8, it is possible to improve accuracy of quantification of the degree and the direction of the sagging S. Further, even when the sagging S occurs in the filament F8, it is possible to uniformalize the output from the rod-like light source R8 on the wafer W.

Figure 11A:
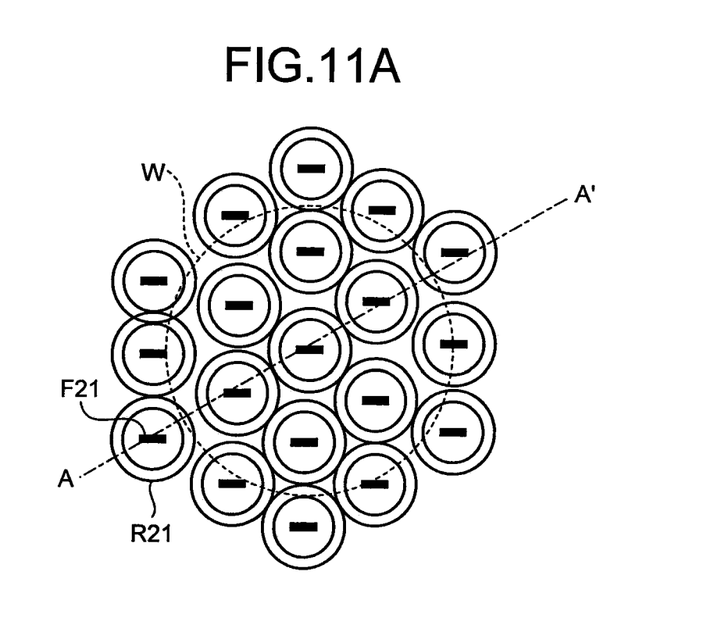
FIGS. 11A and 11B are diagrams of the schematic configuration of a spherical light source section in a semiconductor processing apparatus according to a sixth embodiment of the present invention.
Figure 11B:
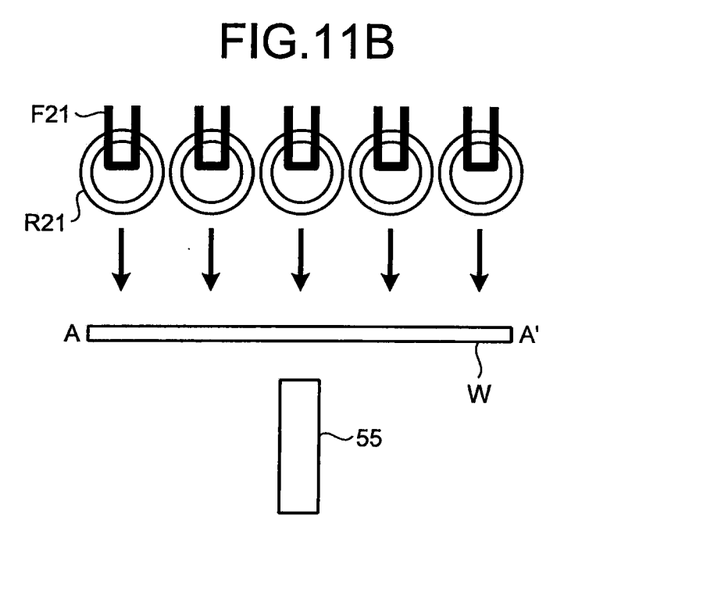

FIGS. 11A and 11B are diagrams of the schematic configuration of a spherical light source section in a semiconductor processing apparatus according to a sixth embodiment of the present invention.

In FIG. 11, the semiconductor processing apparatus includes spherical light sources R21 as a plurality of output sources used for processing of the wafer W and includes a radiation thermometer 55 as an output measuring unit that measures the outputs from the spherical light sources R21. Filaments F21 are respectively provided in the spherical light sources R21. The filaments F21 are stored in quartz tubes. As the spherical light sources R21, for example, spherical halogen lamps can be used. The spherical light sources R21 are horizontally arranged side by side on the wafer W. The radiation thermometer 55 is arranged below the wafer W.

When the spherical light sources R21 are used as a plurality of light sources used for processing of the wafer W, it is possible to monitor the output fluctuations in the spherical light sources R21 by performing processing same as that in the semiconductor processing apparatus shown in FIG. 1.

When the output fluctuations in the spherical light sources R21 are monitored, the radiation thermometer 55 can be moved in one direction as in the semiconductor processing apparatus shown in FIG. 3. When the output fluctuations in the spherical light sources R21 are compensated, the spherical light sources R21 can be moved up and down as in the semiconductor processing apparatus shown in FIG. 5.

When the output fluctuations in the spherical light sources R21 are monitored, the radiation thermometer 55 can be moved in two directions, a plurality of the radiation thermometers 55 having detecting directions different from one another can be used, or the spherical light sources R21 can be moved up and down as in the semiconductor processing apparatus shown in FIG. 6.

Figure 12A:
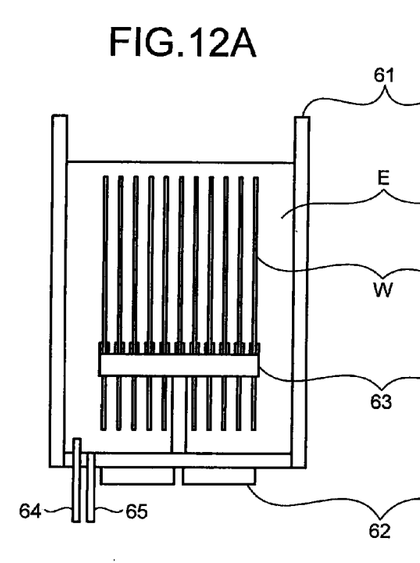
FIGS. 12A and 12B are diagrams of the schematic configuration of a semiconductor processing apparatus according to a seventh embodiment of the present invention.
Figure 12B:
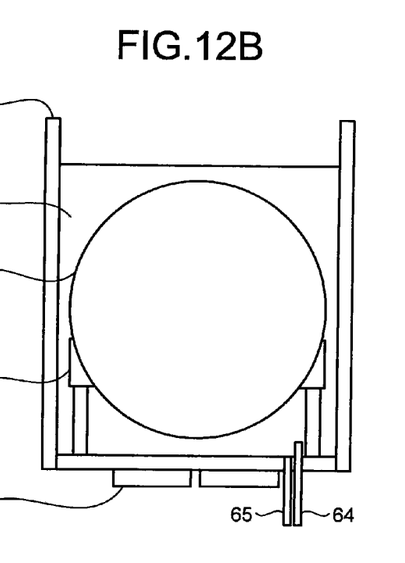
Figure 13:
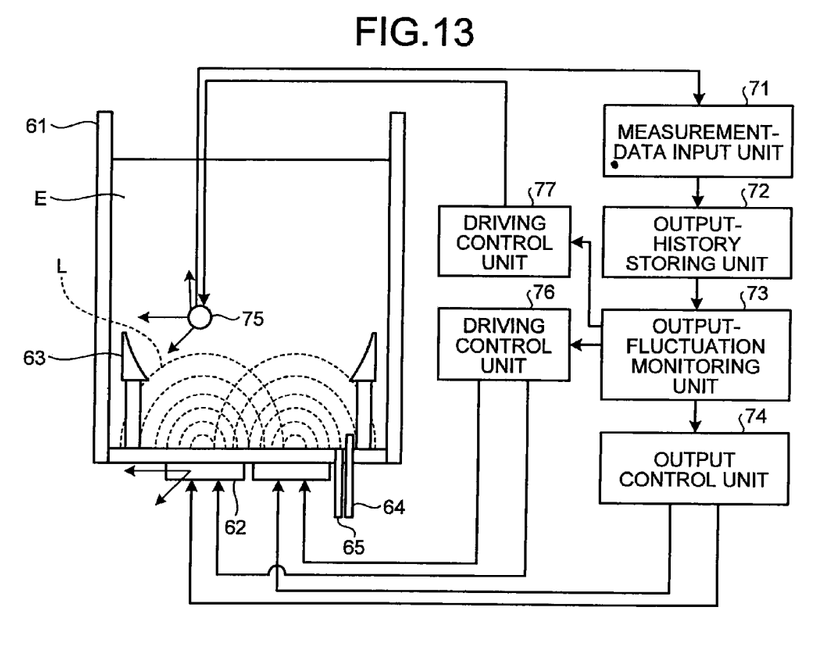
FIG. 13 is a diagram of the schematic configuration of the semiconductor processing apparatus according to the seventh embodiment.

FIGS. 12A and 12B and FIG. 13 are diagrams of the schematic configuration of a semiconductor processing apparatus according to a seventh embodiment of the present invention. FIG. 12A is a side sectional view of a state of ultrasonic cleaning of the wafer W. FIG. 12B is a front sectional view of the state of the ultrasonic cleaning of the wafer W. FIG. 13 is a front sectional view of a state of monitoring of the output fluctuations in ultrasonic transducers 62.

In FIGS. 12A and 12B, the semiconductor processing apparatus includes the ultrasonic transducers 62 as a plurality of output sources used for processing of the wafer W and includes a sound pressure meter 75 as an output measuring unit that measures the outputs from the ultrasonic transducers 62. Biaxial direction driving mechanisms can be incorporated in the ultrasonic transducers 62. A triaxial direction driving mechanism can be incorporated in the sound pressure meter 75.

The semiconductor processing apparatus includes a water tank 61 that stores a chemical E with the wafer immersed therein. The wafer W is supported in the chemical E via a wafer holder 63. As the chemical E, for example, pure water, alcohol, acetone, SC1, SC2, or SPM can be used. The ultrasonic transducers 62 are horizontally arranged side by side under the water tank 61. A water supply pipe 64 that supplies the chemical E into the water tank 61 and a drain pipe 65 that discharges the chemical E from the water tank 61 are provided in the water tank 61.

Further, the semiconductor processing apparatus includes a measurement-data input unit 71, an output-history storing unit 72, an output-fluctuation monitoring unit 73, an output control unit 74, and driving control units 76 and 77. The measurement-data input unit 71 can receive measurement data measured by the sound pressure meter 75. The output-history storing unit 72 can store past and present measurement data input to the measurement-data input unit 71 while distinguishing the measurement data for each of the ultrasonic transducers 62.

The output-fluctuation monitoring unit 73 can monitor, based on the measurement data stored in the output-history storing unit 72, the output fluctuation in each of the ultrasonic transducers 62. The output control unit 74 can separately control, based on the output fluctuations monitored by the output-fluctuation monitoring unit 73, the outputs from the ultrasonic transducers 62. When the output fluctuations in the ultrasonic transducers 62 are monitored, the output control unit 74 can sequentially actuate the ultrasonic transducers 62. When ultrasonic cleaning of the wafer W is performed, the output control unit 74 can collectively actuate the ultrasonic transducers 62. The driving control unit 76 can perform, based on an instruction from the output-fluctuation monitoring unit 73, driving control for the ultrasonic transducers 62. The driving control unit 77 can perform, based on an instruction from the output-fluctuation monitoring unit 73, driving control for the sound pressure meter 75.

When the output fluctuations in the ultrasonic transducers 62 are monitored, the wafer W is removed from the water tank 61 and the sound pressure meter 75 is immersed in the chemical E. The output control unit 74 sequentially actuates the ultrasonic transducers 62. The sound pressure meter 75 sequentially measures the outputs from the ultrasonic transducers 62 and inputs measurement data to the measurement-data input unit 71. When the measurement measured by the sound pressure meter 75 is input to the measurement-data input unit 71, the output-history storing unit 72 stores the measurement data while distinguishing the measurement data for each of the ultrasonic transducers 62.

The output-fluctuation monitoring unit 73 monitors the output fluctuation in each of the ultrasonic transducers 62 referring to the past and present measurement data stored in the output-history storing unit 72. When output fluctuation is detected in one of the ultrasonic transducers 62, the output control unit 74 separately controls the outputs from the ultrasonic transducers 62.

Consequently, even when there is fluctuation in degrees of deterioration in the outputs from the ultrasonic transducers 62 used for the ultrasonic cleaning of the wafer W, it is possible to uniformalize the outputs of the ultrasonic transducers 62 and uniformalize constant sound pressure lines L on the wafer W.

When the output fluctuations in the ultrasonic transducers 62 are monitored, the sound pressure meter 75 can be fixed in one place, can be moved in one direction, or can be moved in a plurality of directions. When the output fluctuations in the ultrasonic transducers 62 are compensated, the sound pressure meter 75 can be moved in one direction or can be moved in a plurality of directions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing apparatus comprising:
a plurality of output sources used for processing of a wafer;
an output measuring unit that measures outputs from the output sources;
a measurement-data input unit that receives input of measurement data measured by the output measuring unit;
an output-history storing unit that stores past and present measurement data input to the measurement-data input unit while distinguishing the measurement data for each of the output sources;
an output-fluctuation monitoring unit that monitors, based on the measurement data stored in the output-history storing unit, output fluctuation in each of the output sources;
an output control unit that separately controls, based on the output fluctuation monitored by the output-fluctuation monitoring unit, the outputs from the output sources;
a first driving unit that moves the output measuring unit relative to the output sources; and
a first driving control unit that performs, based on an instruction from the output-fluctuation monitoring unit, driving control for the first driving unit.

2. The semiconductor processing apparatus according to claim 1, wherein the output control unit controls the outputs from the output sources to uniformalize the outputs on the wafer from the output sources.

3. The semiconductor processing apparatus according to claim 2, further comprising:
a third driving unit that separately rotates the output sources; and
a rotation control unit that performs, based on an instruction from the output-fluctuation monitoring unit, rotation control for the third driving unit.

4. The semiconductor processing apparatus according to claim 3, wherein the rotation control unit rotates the output sources to uniformalize the outputs on the wafer from the output sources.

5. The semiconductor processing apparatus according to claim 1, wherein the output control unit outputs, when output fluctuation in any one of the output sources exceeds a specified value, a message for urging a user to replace the output source.

6. The semiconductor processing apparatus according to claim 1, wherein the first driving unit moves the output measuring unit along an array direction of the output sources.

7. The semiconductor processing apparatus according to claim 6, wherein the first driving unit moves the output measuring unit to right below any one of the output sources that performs output.

8. The semiconductor processing apparatus according to claim 1, wherein the first driving unit moves the output measuring unit along an array direction of the output sources and a direction orthogonal to the array direction.

9. The semiconductor processing apparatus according to claim 1, further comprising:
    a second driving unit that separately moves the output sources to change distances between the output sources and the wafers; and
    a second driving control unit that performs, based on an instruction from the output-fluctuation monitoring unit, driving control for the second driving unit.

10. The semiconductor processing apparatus according to claim 9, wherein the second driving control unit moves the output sources up and down to uniformalize the outputs on the wafer from the output sources.

11. The semiconductor processing apparatus according to claim 1, wherein
    the output sources are rod-like light sources used for thermal treatment of the wafer, and
    the output measuring unit is a radiation thermometer that measures outputs from the rod-like light sources.

12. The semiconductor processing apparatus according to claim 11, wherein, to allow one radiation thermometer to sequentially measure the outputs from the rod-like light sources, the radiation thermometer is moved to right below any one of the rod-like light sources that is about to perform output.

13. The semiconductor processing apparatus according to claim 12, wherein sagging that occurs in a filament of the rod-like light source is detected by moving the radiation thermometer along a longitudinal direction of any one of the rod-like light sources that is currently performing output.

14. The semiconductor processing apparatus according to claim 13, when the sagging is detected, the rod-like light source that is currently performing output is lowered.

15. The semiconductor processing apparatus according to claim 14, wherein the radiation thermometer measures the outputs from the rod-like light sources sideways or obliquely.

16. The semiconductor processing apparatus according to claim 13, wherein the rod-like light source, in which the sagging is detected, is rotated to uniformalize output on the wafer of the rod-like light source.

17. The semiconductor processing apparatus according to claim 16, wherein the rod-like light source is rotated such that the sagging hanging downward is directed to a horizontal direction.

18. The semiconductor processing apparatus according to claim 11, wherein any one of the rod-like light source, output of which falls, is lowered to uniformalize output on the wafer of the rod-like light source.

19. The semiconductor processing apparatus according to claim 1, wherein
    the output sources are spherical light sources used for thermal treatment of the wafer, and
    the output measuring unit is a radiation thermometer that measures outputs from the spherical light sources.

20. The semiconductor processing apparatus according to claim 1, wherein
    the output sources are ultrasonic transducers used for ultrasonic cleaning of the wafer, and
    the output measuring unit is a sound pressure meter that measures outputs from the ultrasonic transducers.

* * * * *